United States Patent
Otsubo et al.

(10) Patent No.: US 10,362,672 B2
(45) Date of Patent: Jul. 23, 2019

(54) RESIN MULTILAYER SUBSTRATE AND METHOD OF MANUFACTURING THE SAME

(71) Applicant: Murata Manufacturing Co., Ltd., Nagaokakyo-shi, Kyoto-fu (JP)

(72) Inventors: Yoshihito Otsubo, Nagaokakyo (JP); Daisuke Tsuruga, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 15/290,149

(22) Filed: Oct. 11, 2016

(65) Prior Publication Data

US 2017/0034911 A1 Feb. 2, 2017

Related U.S. Application Data

(63) Continuation of application No. PCT/JP2015/060614, filed on Apr. 3, 2015.

(30) Foreign Application Priority Data

May 8, 2014 (JP) .................................. 2014-096900

(51) Int. Cl.
*H05K 1/11* (2006.01)
*H05K 1/09* (2006.01)
(Continued)

(52) U.S. Cl.
CPC ............. *H05K 1/09* (2013.01); *H01L 21/486* (2013.01); *H01L 23/145* (2013.01); *H01L 23/49822* (2013.01); *H01L 23/49883* (2013.01); *H05K 1/115* (2013.01); *H05K 3/4038* (2013.01); *H05K 3/4644* (2013.01); *H01L 2224/16225* (2013.01); *H01L 2924/0002* (2013.01); *H01L 2924/19105* (2013.01); *H05K 1/113* (2013.01);
(Continued)

(58) Field of Classification Search
CPC ................. H05K 3/4038; H05K 1/112; H05K 2201/09472; H05K 2201/09545; H05K 2201/09563; H05K 1/09; H05K 1/115; H05K 1/113
See application file for complete search history.

(56) References Cited

U.S. PATENT DOCUMENTS

2002/0038725 A1* 4/2002 Suzuki ................ H05K 1/0373
174/262
2002/0079135 A1 6/2002 Yazaki et al.
(Continued)

FOREIGN PATENT DOCUMENTS

JP 59-193094 A 11/1984
JP 07-122593 A 5/1995
(Continued)

OTHER PUBLICATIONS

JP 2007-088058 English Translation.*
(Continued)

*Primary Examiner* — Steven T Sawyer
(74) *Attorney, Agent, or Firm* — Keating & Bennett, LLP

(57) ABSTRACT

A resin multilayer substrate includes a laminate including a plurality of resin layers and an interlayer connecting conductor which extends through at least one of the plurality of resin layers and is directly exposed to an outside of the laminate.

10 Claims, 10 Drawing Sheets

(51) Int. Cl.
*H05K 3/40* (2006.01)
*H05K 3/46* (2006.01)
*H01L 23/14* (2006.01)
*H01L 23/498* (2006.01)
*H01L 21/48* (2006.01)
*H05K 3/34* (2006.01)

(52) U.S. Cl.
CPC ........ *H05K 3/3436* (2013.01); *H05K 3/3442* (2013.01); *H05K 2201/032* (2013.01); *H05K 2201/09472* (2013.01); *H05K 2201/09545* (2013.01); *H05K 2201/09563* (2013.01); *H05K 2203/06* (2013.01)

(56) References Cited

U.S. PATENT DOCUMENTS

| | | | |
|---|---|---|---|
| 2005/0067177 A1 | 3/2005 | Saito et al. | |
| 2008/0093117 A1 | 4/2008 | Oikawa et al. | |
| 2008/0142253 A1* | 6/2008 | Salama | H05K 1/162 174/258 |
| 2008/0314633 A1* | 12/2008 | Kang | H05K 3/4007 174/264 |
| 2008/0315431 A1* | 12/2008 | Ahn | H01L 23/13 257/774 |
| 2011/0147058 A1 | 6/2011 | Kawano et al. | |
| 2012/0175153 A1 | 7/2012 | Kaneko et al. | |
| 2012/0319254 A1 | 12/2012 | Kikuchi et al. | |
| 2013/0299219 A1 | 11/2013 | Chisaka et al. | |
| 2015/0101852 A1* | 4/2015 | Park | H05K 1/115 174/258 |

FOREIGN PATENT DOCUMENTS

| | | |
|---|---|---|
| JP | 08-088470 A | 4/1996 |
| JP | 11-026638 A | 1/1999 |
| JP | 2002-290022 A | 10/2002 |
| JP | 2004-221388 A | 8/2004 |
| JP | 2005-108950 A | 4/2005 |
| JP | 2005-244108 A | 9/2005 |
| JP | 3867523 B2 | 1/2007 |
| JP | 2007-088058 A | 4/2007 |
| JP | 2010-153438 A | 7/2010 |
| JP | 2011-009786 A | 1/2011 |
| JP | 2011-035242 A | 2/2011 |
| JP | 2011-129844 A | 6/2011 |
| JP | 2012-146793 A | 8/2012 |
| WO | 2011/108308 A1 | 9/2011 |
| WO | 2012/111711 A1 | 8/2012 |

OTHER PUBLICATIONS

WO2012-111711 English Translation.*
Official Communication issued in International Application No. PCT/JP2015/060614, dated Jun. 23, 2015.
Official Communication issued in Japanese Patent Application No. 2016-517843, dated Feb. 13, 2018.

* cited by examiner

SN-PLATED BONDING SURFACE

RESIN MULTILAYER SUBSTRATE AND METHOD OF MANUFACTURING THE SAME

CROSS REFERENCE TO RELATED APPLICATIONS

This application claims the benefit of priority to Japanese Patent Application 2014-096900 filed May 8, 2014 and is a Continuation Application of PCT/JP2015/060614 filed on Apr. 3, 2015, the entire contents of each application are hereby incorporated herein by reference.

BACKGROUND OF THE INVENTION

1. Field of the Invention

The present invention relates to resin multilayer substrates and methods of manufacturing the same.

2. Description of the Related Art

An exemplary wiring board with a built-in semiconductor element is disclosed in WO 2011/108308. A wiring structure layer is formed in an upper portion of this wiring board. In this wiring structure layer, wiring lines are disposed on the upper surface of an insulating layer, with a protective insulating layer being disposed so as to cover the upper side of this insulating layer. It should be noted that the protective insulating layer has openings, through which the wiring lines are partially exposed.

A component is sometimes mounted on the surface of a resin multilayer substrate. In recent years, it has been desired to reduce the terminal size of, and the gap between, mounted components. It is difficult to appropriately address these needs, however, in a structure on which a component is mounted with a conductor pattern, such as copper foil exposed at a component mounting surface, interposed therebetween, as has been conventionally employed. The same applies to the structure of the wiring board described in WO 2011/108308, for example, because when a component is to be mounted on the topmost surface, the component will be mounted with a conductor pattern, which serves as the wiring lines partially exposed at the topmost surface, interposed therebetween.

SUMMARY OF THE INVENTION

Accordingly, preferred embodiments of the present invention provide a resin multilayer substrate that readily achieves a smaller gap between mounted components, and a method of manufacturing the same.

A resin multilayer substrate according to a preferred embodiment of the present invention includes a laminate including a plurality of resin layers and an interlayer connecting conductor which extends through at least one of the plurality of resin layers and which is disposed so as to be directly exposed to outside of the laminate.

According to preferred embodiments of the present invention, since the interlayer connecting conductor is directly exposed to the outside of the laminate in the resin multilayer substrate, a smaller gap between mounted components is readily achieved.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

First Preferred Embodiment

Figure 1:
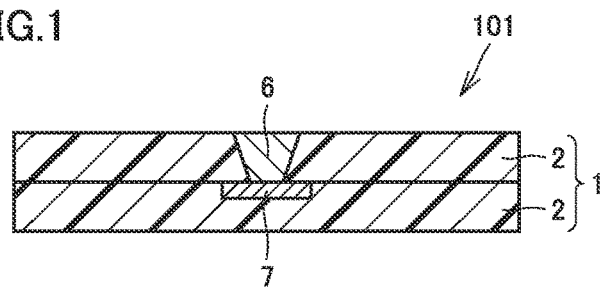
FIG. 1 is a cross-sectional view of a resin multilayer substrate according to a first preferred embodiment of the present invention.

Referring to FIG. 1, a resin multilayer substrate according to a first preferred embodiment of the present invention is described.

A resin multilayer substrate 101 according to this preferred embodiment includes a laminate 1 obtained by laminating a plurality of resin layers 2 and integrating them together, where laminate 1 is provided with an interlayer connecting conductor 6 which extends through at least one of the plurality of resin layers 2 and which is disposed so as to be directly exposed to the outside of laminate 1. For the purpose illustration, an interlayer connecting conductor extending through at least one of the plurality of resin layers 2 and disposed so as to be directly exposed to the outside of laminate 1 in this manner will hereinafter be referred to as a "direct via."

Interlayer connecting conductor 6 is connected to a conductor pattern 7 inside laminate 1, and conductor pattern 7 may be connected to another wiring line as appropriate. While FIG. 1 illustrates an example where the configuration of resin multilayer substrate 101 has been simplified to include only one interlayer connecting conductor 6, resin multilayer substrate 101 may actually include a plurality of interlayer connecting conductors 6. Resin multilayer substrate 101 may include, apart from interlayer connecting conductor 6, an external electrode in another portion. Resin multilayer substrate 101 may include a built-in component and/or a surface-mounted component. While FIG. 1 illustrates an example where laminate 1 includes two resin layers 2, laminate 1 is not limited to this configuration but may include more resin layers 2.

In this preferred embodiment, since interlayer connecting conductor 6 is provided so as to be directly exposed to the outside of laminate 1, the interlayer connecting conductor 6 is able to be utilized when mounting another component.

Figure 2:
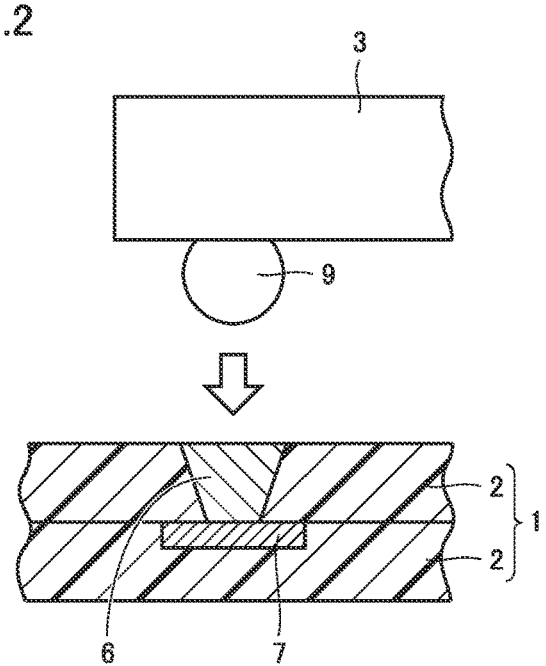
FIG. 2 is an illustrative diagram of how a component including a bump is mounted on the resin multilayer substrate according to the first preferred of the present invention.
Figure 3:
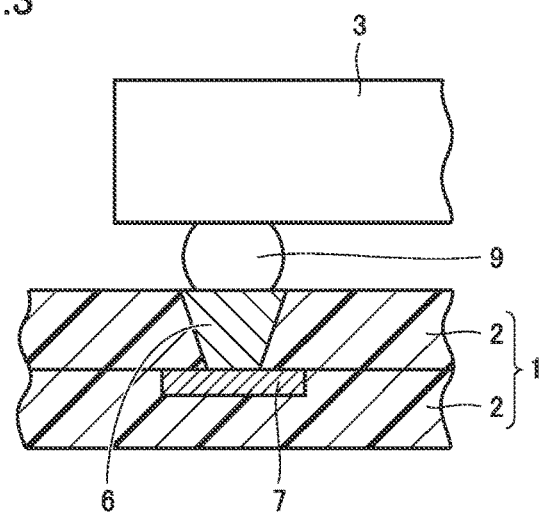
FIG. 3 is a fragmentary cross-sectional view after the component including the bump has been mounted on the resin multilayer substrate according to the first preferred of the present invention.

As shown in FIG. 2, for example, when a component 3 including a bump 9 at its lower surface is to be mounted on the upper surface of laminate 1, direct connection is able to be made between interlayer connecting conductor 6 and bump 9 as shown in FIG. 3.

Figure 4:
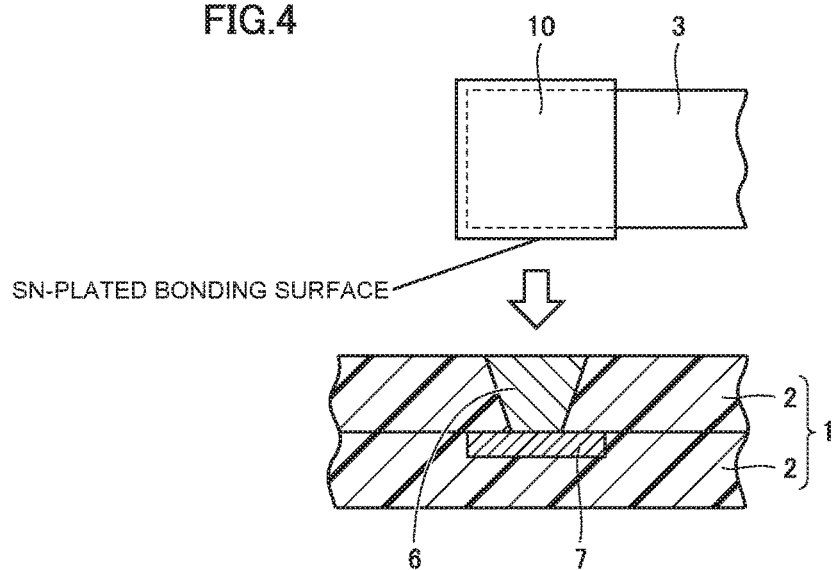
FIG. 4 is an illustrative diagram of how a component including an external electrode is mounted on the resin multilayer substrate according to the first preferred of the present invention.
Figure 5:
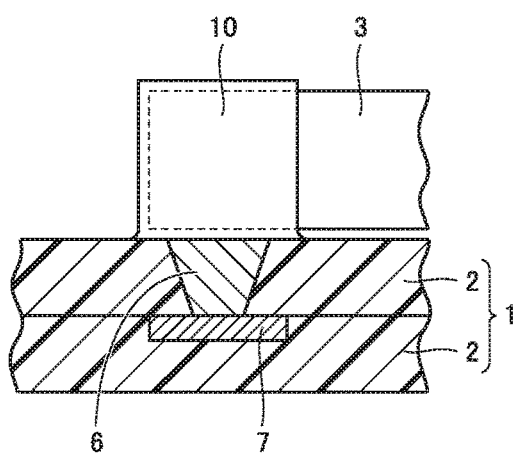
FIG. 5 is a fragmentary cross-sectional view after the component including the external electrode has been mounted on the resin multilayer substrate according to the first preferred of the present invention.

As shown in FIG. 4, for example, when component 3 including an external electrode 10 formed by plating or the like is to be mounted on the upper surface of laminate 1, direct connection is able to be made between interlayer connecting conductor 6 and external electrode 10 as shown in FIG. 5.

In this preferred embodiment, since there is no need for resin multilayer substrate 101 to be provided with a conductor pattern as a pad electrode that covers the upper side of interlayer connecting conductor 6, a smaller gap between mounted components is readily achieved.

It is preferable that interlayer connecting conductor 6 be made of a variable melting point bonding material. The "variable melting point bonding material" refers to a bonding material having different melting points between when it is in a paste state before being heated and when it has transformed into an intermetallic compound after being heated in the paste state at a normal reflow temperature (about 250° C., for example). With the variable melting point bonding material, interlayer connecting conductor 6 having a high melting point is able to be realized as needed, thus preventing the interlayer connecting conductor from melting at undesirable timing such as during reflow.

For the variable melting point bonding material as used herein, it is preferable to use a conductive material described in Japanese Patent No. 5018978. That is, it is preferable that the variable melting point bonding material as used herein be a conductive material including a metallic component made of a first metal and a second metal having a higher melting point than the first metal and producing an intermetallic compound by reaction with the first metal, that the first metal be Sn or an alloy containing greater than or equal to about 70 weight % Sn, that the second metal be a Cu—Mn alloy or Cu—Ni alloy, and that the first metal and the second metal be conductive materials to produce an intermetallic compound exhibiting a melting point of greater than or equal to about 310° C., for example.

It is preferable that this variable melting point bonding material include a flux component. In this variable melting point bonding material, it is preferable that the first metal be Sn or an alloy containing greater than or equal to about 85 weight % Sn, for example. In this variable melting point bonding material, it is preferable that the percentage of the second metal in the metallic component be greater than or equal to about 30 volume %, for example. In this variable melting point bonding material, it is preferable that the first metal be Sn alone, or an alloy containing Sn and at least one selected from the group consisting of Cu, Ni, Ag, Au, Sb, Zn, Bi, In, Ge, Al, Co, Mn, Fe, Cr, Mg, Mn, Pd, Si, Sr, Te, and P. In this variable melting point bonding material, it is preferable that the second metal be a Cu—Mn alloy in which the percentage of Mn in the second metal is about 10 weight % to about 15 weight %, or a Cu—Ni alloy in which the percentage of Ni in the second metal is about 10 weight % to about 15 weight %, for example. In this variable melting point bonding material, it is preferable that the second metal have a specific surface area of greater than or equal about 0.05 $m^2 \cdot g^{-1}$, for example. In this variable melting point bonding material, it is preferable that the periphery of the second metal be coated with at least a portion of the first metal.

Using the variable melting point bonding material described above is preferable because the melting point is able to be increased with a common reflow profile.

Conventionally, solder is usually used in a structure on which a component is mounted with a conductor pattern exposed at the surface interposed therebetween. When the solder used is used, however, during reflow for a product on which a component has been mounted, the already applied solder may melt to cause a displacement of the mounted component. Moreover, the melting of solder at such undesirable timing may result in detachment of the mounted component. Furthermore, the issue of a splash phenomenon of solder arises during connection operation using solder. Therefore, while it is preferable to be able to mount a component without using solder, a structure and a method therefore have not been heretofore discovered. With regard to these problems, the following effects are able to be obtained using the variable melting point bonding material described above.

When the variable melting point bonding material described above is used, heat and pressure are applied in a thermocompression bonding step for forming integrated laminate 1, such that $Cu_6Sn_5$ and $Cu_3Sn$ are formed. $Cu_6Sn_5$ has a melting point of 415° C., and $Cu_3Sn$ has a melting point of 676° C. Here, if a component to be mounted has a bonding surface plated with Sn, the bonding material will not melt, and furthermore, an intermetallic compound will be formed between Sn contained in the Sn plating and a bonding member, thus attaining satisfactory connection. That is, if a surface to be bonded of a component 3 to be mounted has been plated with Sn as shown in FIG. 4, this component 3 is able to be directly bonded to interlayer connecting conductor 6 without using solder as shown in FIG. 5.

Accordingly, as the resin multilayer substrate, it is preferable that a component having a Sn-plated bonding surface be bonded, with the Sn-plated surface as a bonding surface, to the interlayer connecting conductor defining and functioning as a direct via.

Second Preferred Embodiment

Figure 6:
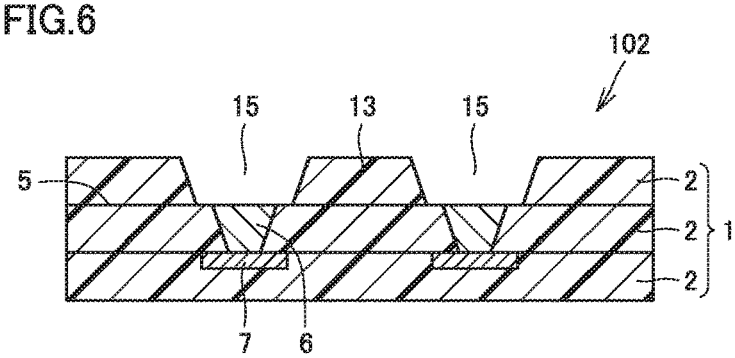
FIG. 6 is a cross-sectional view of a resin multilayer substrate according to a second preferred embodiment of the present invention.

Referring to FIG. 6, a resin multilayer substrate according to a second preferred embodiment of the present invention is described. A resin multilayer substrate 102 according to this preferred embodiment has the same basic configuration as that of resin multilayer substrate 101 described in the first preferred embodiment, but differs in the following respects.

In resin multilayer substrate 102, two or more interlayer connecting conductors 6 are spaced a distance from each other toward one main surface of laminate 1, with a raised portion 13 being provided between interlayer connecting conductors 6, the raised portion being higher than a surface 5 of resin layer 2 holding interlayer connecting conductors 6 at which interlayer connecting conductors 6 are exposed. Stated another way, openings 15 are provided in the topmost resin layer 2. Interlayer connecting conductors 6 are exposed through openings 15.

While two interlayer connecting conductors 6 are shown in the example of FIG. 6, there may be three or more interlayer connecting conductors 6. As shown in FIG. 6, raised portion 13 may be formed by leaving a portion of another resin layer 2 laminated on resin layer 2 holding interlayer connecting conductors 6. As shown in FIG. 6, raised portion 13 may be a portion remaining as a result of forming openings 15 in the topmost resin layer 2.

The same effect as in the first preferred embodiment is obtained in this preferred embodiment as well. In this preferred embodiment, the portions where interlayer connecting conductors 6 are exposed are separated from each other by raised portion 13. Thus, if some type of bonding material is used for connection with interlayer connecting conductors 6 and this bonding material transforms into liquid, the bonding material is held back by raised portion 13. Accordingly, the occurrence of a short circuit between adjacent interlayer connecting conductors 6 is able to be prevented.

If a component to be mounted is provided with bumps, stable bonding is able to be effected by providing openings 15 with uniform dimensions such that the bumps will enter openings 15. Even if the bumps provided on the component are made of solder, the occurrence of a short circuit is able to be prevented because interlayer connecting conductors 6 are separated from each other by raised portion 13.

Third Preferred Embodiment

Figure 7:
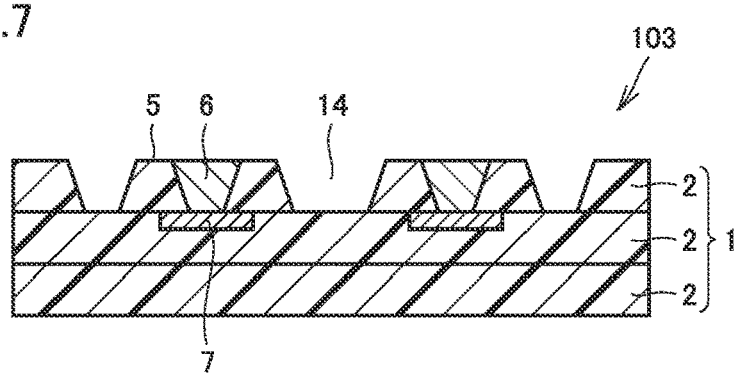
FIG. 7 is a cross-sectional view of a resin multilayer substrate according to a third preferred embodiment of the present invention.

Referring to FIG. 7, a resin multilayer substrate in a third preferred embodiment of the present invention is described. A resin multilayer substrate 103 in this preferred embodiment has the same basic configuration as that of resin multilayer substrate 102 described in the second preferred embodiment, but differs in the following respects.

In resin multilayer substrate 103, two or more interlayer connecting conductors 6 are spaced a distance from each other toward one main surface of laminate 1, with a recess 14 being provided between interlayer connecting conductors 6, the recess being lower than the surface at which interlayer connecting conductors 6 are exposed.

The same effect as in the first preferred embodiment is obtained in this preferred embodiment as well. In this preferred embodiment, the portions where interlayer connecting conductors 6 are exposed are separated from each other by recess 14. In this preferred embodiment, if some type of bonding material is used for connection with interlayer connecting conductors 6, and this bonding material transforms into liquid and flows along surface 5, the flowing bonding material is prevented from being directly joined to its adjacent interlayer connecting conductor 6 because of the presence of recess 14 between adjacent interlayer connecting conductors 6. Accordingly, the occurrence of a short circuit between adjacent interlayer connecting conductors 6 is prevented.

If a component to be mounted has a bulging portion between its terminals, mounting of this component on a flat substrate surface suffers from a so-called belly contact phenomenon in which the bulging portion contacts the substrate surface before the terminals do, resulting in insufficient contact of the terminals with the substrate surface. Providing recess 14 between interlayer connecting conductors 6 as in this preferred embodiment is preferable because the belly contact phenomenon is able to be avoided. If a component to be mounted has an undulated lower surface, the resin multilayer substrate provided with recess 14 as in this preferred embodiment is again preferable because it allows mounting of the component with little effect of the undulation.

Fourth Preferred Embodiment

Figure 8:
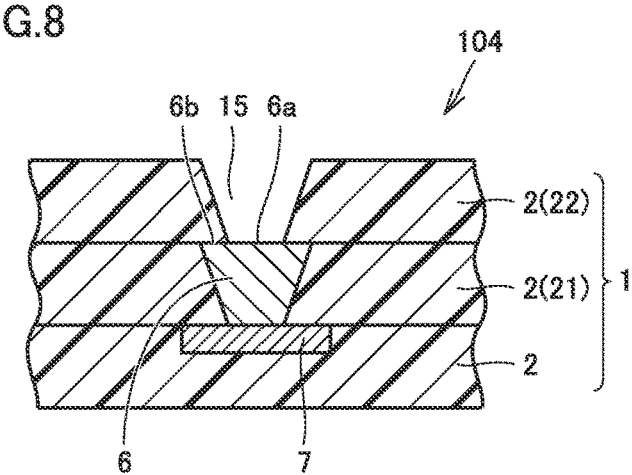
FIG. 8 is a fragmentary cross-sectional view of a resin multilayer substrate according to a fourth preferred embodiment of the present invention.

Referring to FIG. 8, a resin multilayer substrate in a fourth preferred embodiment of the present invention is described. A resin multilayer substrate 104 in this preferred embodiment has the same basic configuration as that of resin multilayer substrate 101 described in the first preferred embodiment, but differs in the following respects.

In resin multilayer substrate 104, another resin layer 2 is laminated on the upper side of resin layer 2 holding interlayer connecting conductor 6. In resin multilayer substrate 104, if resin layer 2 holding interlayer connecting conductor 6 out of the plurality of resin layers 2 is referred to as a first resin layer 21, a second resin layer 22 covering at least a portion of an outer edge 6b of interlayer connecting conductor 6 while exposing at least a central portion 6a of interlayer connecting conductor 6 overlies first resin layer 21, as seen from the side at which interlayer connecting conductor 6 is exposed. Opening 15 is formed in second resin layer 22.

In this preferred embodiment, since at least a portion of outer edge 6b of interlayer connecting conductor 6 is covered with second resin layer 22, detachment of interlayer connecting conductor 6 is prevented. The result is an improved bonding strength during component mounting.

While shown in cross-sectional view in FIG. 8, second resin layer 22 does not necessarily cover outer edge 6b of interlayer connecting conductor 6 around the entire circumference. It is preferable, however, for second resin layer 22 to cover outer edge 6b of interlayer connecting conductor 6 around the entire circumference. This is because the covering around the entire circumference more reliably prevents the detachment of interlayer connecting conductor 6.

Fifth Preferred Embodiment

Figure 9:
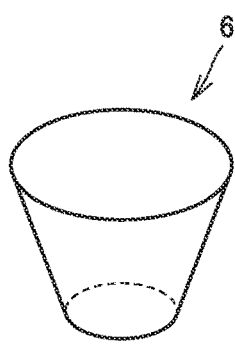
FIG. 9 is a perspective view of an interlayer connecting conductor included in the first to fourth preferred embodiments of the present invention, which has been removed alone.

Interlayer connecting conductor 6 illustrated in the above preferred embodiments can be formed by forming a via hole extending through resin layer 2 having copper foil formed on its main surface, for example, by subjecting resin layer 2 to laser machining, then filling the via hole with a material in paste form, and then curing the material by heating and pressurization in a thermocompression bonding step. Since it was assumed that this via hole was to be formed by applying a laser beam to one position, interlayer connecting conductor 6 had a limited area. FIG. 9 shows interlayer connecting conductor 6 used in the above preferred embodiments, which has been removed alone. Interlayer connecting conductor 6 had such a simple truncated conical shape.

However, the shape of the interlayer connecting conductor as a direct via is not limited to such a shape. To form the interlayer connecting conductor as a direct via, a single via hole may be formed by a plurality of applications.

Figure 10:
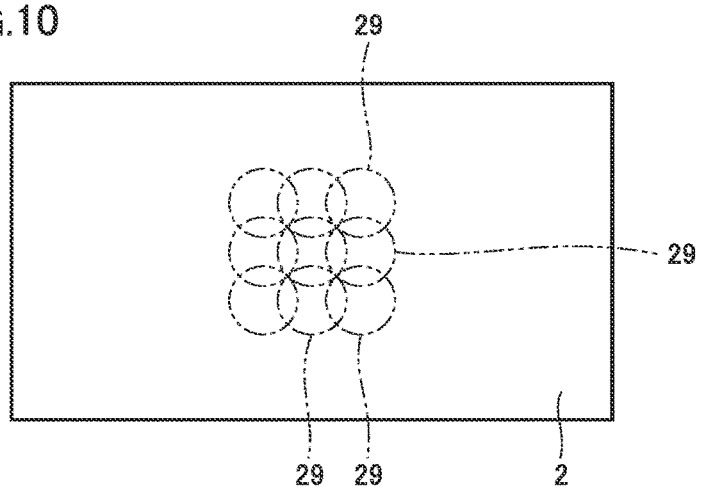
FIG. 10 is an illustrative diagram of application positions of a laser beam used during the fabrication of a resin multilayer substrate according to a fifth preferred embodiment of the present invention.
Figure 11:
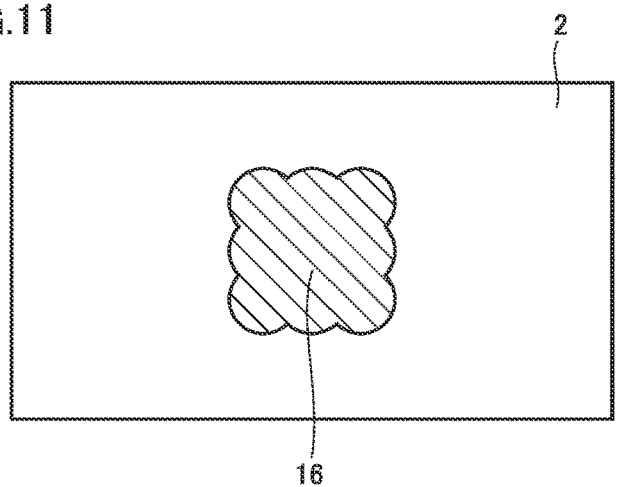
FIG. 11 is a plan view of one of resin layers used during the fabrication of the resin multilayer substrate according to the fifth preferred embodiment of the present invention.
Figure 12:
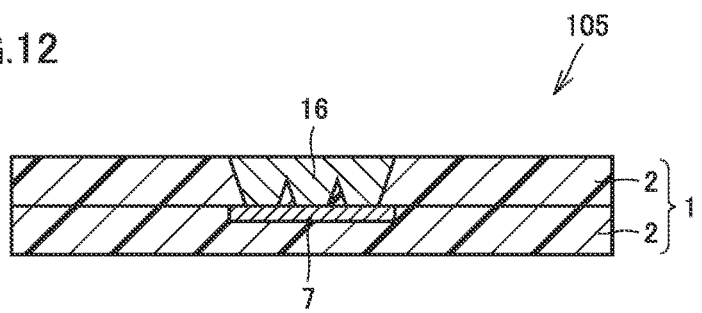
FIG. 12 is a cross-sectional view of the resin multilayer substrate according to the fifth preferred embodiment of the present invention.

Referring to FIGS. 10 to 12, a resin multilayer substrate in a fifth preferred embodiment of the present invention is described. As shown in FIG. 10, a plurality of application regions 29 may be set such that they are arranged closely to one another in a limited area of a single resin layer 2, and a laser beam may be repeatedly applied while the application position is shifted with each application.

A large via hole can be formed in resin layer 2, thus allowing the formation of an interlayer connecting conductor 16 having a large area as shown in FIG. 11. By using resin layer 2 thus formed, a resin multilayer substrate 105 as shown in FIG. 12 can be obtained.

When a large area is needed to bond with a component or the like, the need can be addressed by forming interlayer connecting conductor 16 having a large area as needed in this manner.

While this preferred embodiment illustrates an example where the laser beam is applied to 3×3, namely, a total of 9 regions arranged to define a square, this is merely exemplary and a variety of patterns are conceivable for the number of application regions of the laser beam and positional relations among them.

Sixth Preferred Embodiment

Figure 13:
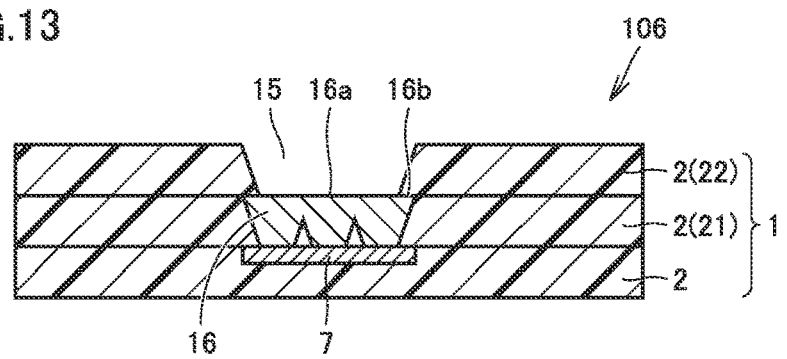
FIG. 13 is a cross-sectional view of a resin multilayer substrate according to a sixth preferred embodiment of the present invention.

Referring to FIG. 13, a resin multilayer substrate according to a sixth preferred embodiment of the present invention is described. A resin multilayer substrate 106 shown in FIG. 13 can be obtained by laminating another resin layer 2 on the upper side of the configuration of resin multilayer substrate 105 shown in FIG. 12, and providing opening 15 in the resin layer 2. Resin layer 2 holding interlayer connecting conductor 16 can be regarded as first resin layer 21, and resin layer 2 placed thereon can be regarded as second resin layer 22.

Figure 14:
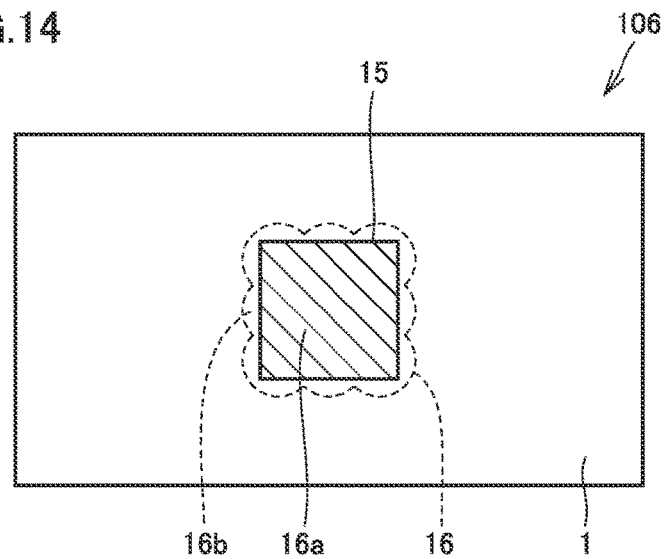
FIG. 14 is a plan view of the resin multilayer substrate according to the sixth preferred embodiment of the present invention.

FIG. 14 shows resin multilayer substrate 106 shown in FIG. 13 as seen in plan view. Interlayer connecting conductor 16 is partially exposed through square opening 15 in the upper surface of laminate 1. Opening 15 has been formed by punching, for example. A central portion 16a of interlayer connecting conductor 16 is exposed, whereas an outer edge 16b is hidden by the resin layer. While outer edge 16b is covered and hidden to some degree around the entire circumference in the example shown in FIG. 14, the outer edge does not need to be covered and hidden around the entire circumference. It is preferable, however, for the portion covered with the resin layer to be uniformly present around the entire circumference. This is because interlayer connecting conductor 16 is able to be pressed stably and uniformly in every direction in such a configuration.

Interlayer connecting conductor 16 is more likely to be detached particularly when the area of interlayer connecting conductor 16 increases. Pressing at least a portion of outer edge 16b by resin layer 2 in such a configuration is preferable because the possibility of detachment of interlayer connecting conductor 16 can be reduced.

Opening 15 provided in second resin layer 22 may be formed after the lamination of second resin layer 22, or, alternatively, it may be formed in advance in the form of a single sheet of second resin layer 22 before the lamination. If opening 15 is formed in advance in second resin layer 22, opening 15 may be formed by stamping. Alternatively, opening 15 may be formed by laser machining.

Seventh Preferred Embodiment

Figure 15:
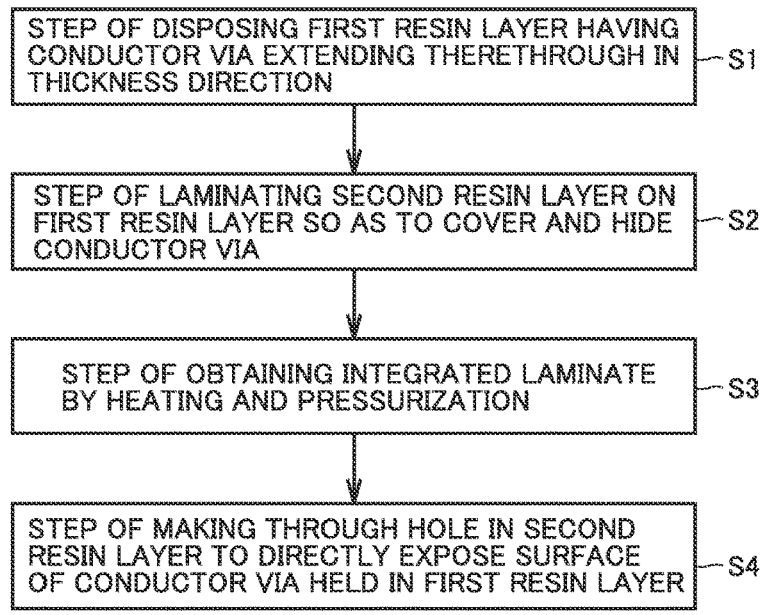
FIG. 15 is a flowchart of a method of manufacturing a resin multilayer substrate according to a seventh preferred embodiment of the present invention.

Referring to FIGS. 15 to 22, a method of manufacturing a resin multilayer substrate in a seventh preferred embodiment of the present invention is described. FIG. 15 shows a flowchart of the method of manufacturing the resin multilayer substrate in this preferred embodiment.

The method of manufacturing the resin multilayer substrate in this preferred embodiment includes a step S1 of disposing a first resin layer having an interlayer connecting conductor extending therethrough in a thickness direction, a step S2 of laminating a second resin layer on the first resin layer so as to cover and hide the interlayer connecting conductor, a step S3 of heating and pressurizing a laminate of a plurality of resin layers including the first resin layer and the second resin layer, to obtain an integrated laminate, and a step S4 of making a hole extending through the second resin layer included in the laminate by performing removal machining on the second resin layer, to directly expose a surface of the interlayer connecting conductor held in the first resin layer facing the second resin layer.

Each of these steps will now be described in detail. In addition, steps usually included before and after these steps when performing a method of manufacturing a resin multilayer substrate will also be described.

Figure 16:
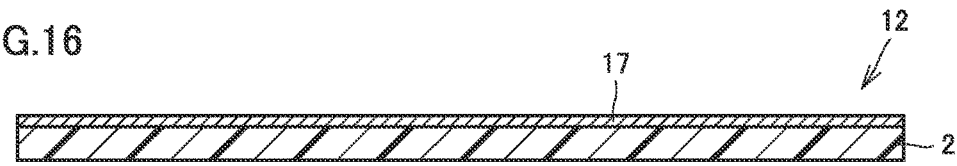
FIG. 16 is an illustrative diagram of a first step of the method of manufacturing the resin multilayer substrate according to the seventh preferred embodiment of the present invention.

First, a resin sheet 12 with conductor foil as shown in FIG. 16 is prepared. Resin sheet 12 with conductor foil is a sheet having a structure in which conductor foil 17 has been adhered to one surface of resin layer 2. Resin layer 2 is a thermoplastic resin, for example. In this preferred embodiment, resin layer 2 is mainly made of thermoplastic PI (polyimide), for example. Other than the thermoplastic PI, the material for resin layer 2 may be PEEK (polyether ether ketone), PEI (polyetherimide), PPS (polyphenylene sulfide), LCP (liquid crystal polymer), or the like. Conductor foil 17 is metal foil made of Cu, for example. In this preferred embodiment, metal foil having a thickness of about 18 μm is used as conductor foil 17, for example. It should be noted that other than Cu, the material for conductor foil 17 may be Ag, Al, SUS, Ni, Au, or may be an alloy of two or more different metals selected from these types of metals. While conductor foil 17 preferably has a thickness of about 18 μm in this preferred embodiment, the thickness of about greater than or equal to about 3 μm and less than or equal to about 40 μm is preferably used as the thickness of conductor foil 17, for example. That is, the thickness of conductor foil 17 should simply be such that it allows circuit formation.

When preparing resin sheet 12 with conductor foil, a plurality of resin sheets 12 with conductor foil may be prepared, or, alternatively, a single resin sheet 12 with conductor foil may be prepared, in which regions to be cut separately later into a plurality of resin sheets are provided.

Figure 17:
FIG. 17 is an illustrative diagram of a second step of the method of manufacturing the resin multilayer substrate according to the seventh preferred embodiment of the present invention.

Then, on the surface of conductor foil 17 of resin sheet 12 with conductor foil, a resist pattern corresponding to a desired circuit pattern is printed by screen printing or the like. Then, etching is performed with this resist pattern as a mask, to remove a portion of conductor foil 17 which is not covered with a resist pattern 13. A portion of conductor foil 17 remaining after this etching is referred to as a "conductor pattern." The resist pattern is then removed with a cleaning solution or the like. Desired conductor pattern 7 is thus obtained on one surface of resin layer 2, as shown in FIG. 17.

Figure 18:
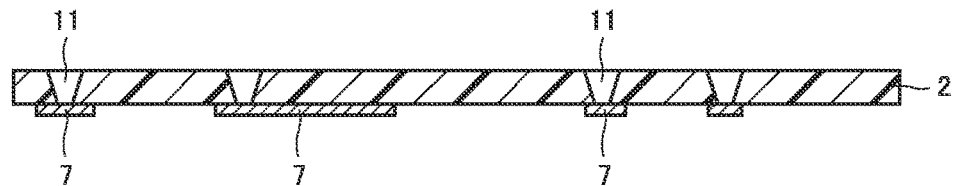
FIG. 18 is an illustrative diagram of a third step of the method of manufacturing the resin multilayer substrate according to the seventh preferred embodiment of the present invention.

Then, as shown in FIG. 18, a carbon dioxide laser beam is applied to a surface of resin layer 2 opposite to the surface where conductor pattern 7 of resin sheet 12 with conductor foil is adhered, to thereby form via holes 11 extending through resin layer 2. Via holes 11 extend through resin layer 2, but not through conductor pattern 7. Then, smears (not shown) in via holes 11 are removed as needed. While the carbon dioxide laser beam is used here in order to form via holes 11, other types of laser beams may be used. It is preferable, however, to use a laser beam that extends through resin layer 2 but not through conductor pattern 7. Alternatively, other methods than the laser beam application may be used in order to form via holes 11.

Figure 19:
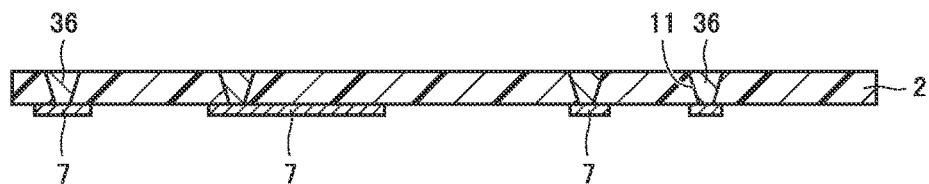
FIG. 19 is an illustrative diagram of a fourth step of the method of manufacturing the resin multilayer substrate according to the seventh preferred embodiment of the present invention.

Then, as shown in FIG. 19, via holes 11 are filled with a conductive paste by screen printing or the like. It is preferable for the filling conductive paste to have a higher melting point than solder. It is preferable for the filling conductive paste to be a variable melting point bonding material. The detailed conditions for the variable melting point bonding material are as has been already described in the first preferred embodiment. By filling the via holes with the conductive paste in this manner, interlayer connecting conductors 36 are formed.

While conductor pattern 7 is first formed on the surface of resin layer 2, then via holes 11 are formed and filled with the conductive paste to form interlayer connecting conductors 36 here, this order is not limiting. After via holes 11 are formed in resin layer 2 and filled with the conductive paste to form interlayer connecting conductors 36, conductor pattern 7 may be formed on the surface of resin layer 2.

Figure 20:
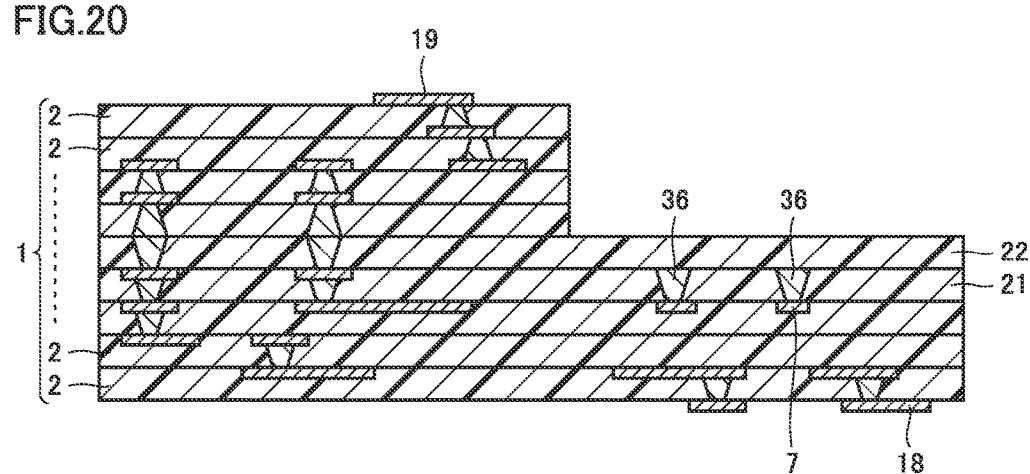
FIG. 20 is an illustrative diagram of a fifth step of the method of manufacturing the resin multilayer substrate according to the seventh preferred embodiment of the present invention.

As shown in FIG. 20, a plurality of resin layers 2 are laminated to form a substrate. At the bottommost layer of the substrate, resin layer 2 is disposed with its surface on which conductor pattern 7 has been formed facing downward, such that conductor pattern 7 is disposed on the lower surface of the substrate. Thus, conductor pattern 7 disposed on the lower surface of the substrate defines and functions as an external electrode 18.

At the topmost surface of the substrate, on the other hand, resin layer 2 is disposed with its surface on which conductor pattern 7 has been formed facing upward, such that conductor pattern 7 is disposed on the topmost surface of the substrate. Thus, conductor pattern 7 disposed on the topmost surface of the substrate serves as an external electrode 19. The resin multilayer substrate may have a simple rectangular shape as seen in cross section, or, alternatively, may have a thickness that varies according to location as shown in FIG. 20. The shape shown in FIG. 20 is merely exemplary and not intended to be limiting.

During the lamination of the plurality of resin layers 2 as shown in FIG. 20, steps S1 and S2 are performed. That is, as step S1, first resin layer 21 having interlayer connecting conductors 36 extending therethrough in the thickness direction is disposed. Then, as step S2, second resin layer 22 is laminated on first resin layer 21 so as to cover and hide interlayer connecting conductors 36. Upon completion of the lamination of all resin layers 2 as shown in FIG. 20, as step S3, heating and pressurization are applied to the laminate as a whole, to thus obtain integrated laminate 1.

It should be noted that, before the completion of the lamination of all resin layers 2, temporary compression bonding may be carried out at a temperature lower than the thermocompression bonding temperature when only some of resin layers 2 have been laminated. The temporary compression bonding is carried out at a temperature of, for example, greater than or equal to about 150° C. and less than or equal to about 200° C. As a result of the temporary compression bonding, resin layers 2 laminated up to this point in time are temporarily fixed.

Figure 21:
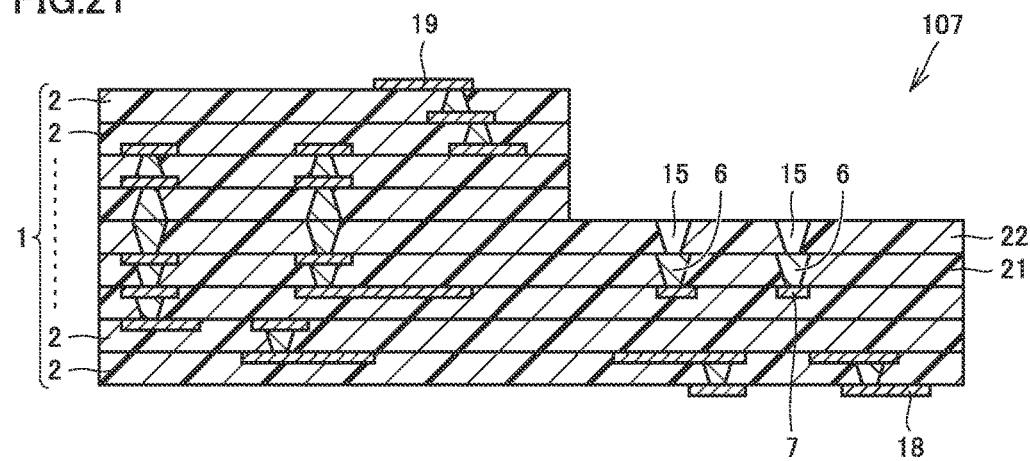
FIG. 21 is an illustrative diagram of a sixth step of the method of manufacturing the resin multilayer substrate according to the seventh preferred embodiment of the present invention.

Then, as step S4, holes extending through second resin layer 22 included in integrated laminate 1 as shown in FIG. 20 are made by performing removal machining on second resin layer 22. That is, openings 15 are formed as shown in FIG. 21. Consequently, the surfaces of interlayer connecting conductors 36 held in first resin layer 21 facing second resin layer 22 are directly exposed. Interlayer connecting conductors 36 define and function as interlayer connecting conductors 6. A resin multilayer substrate 107 is thus obtained.

Figure 22:
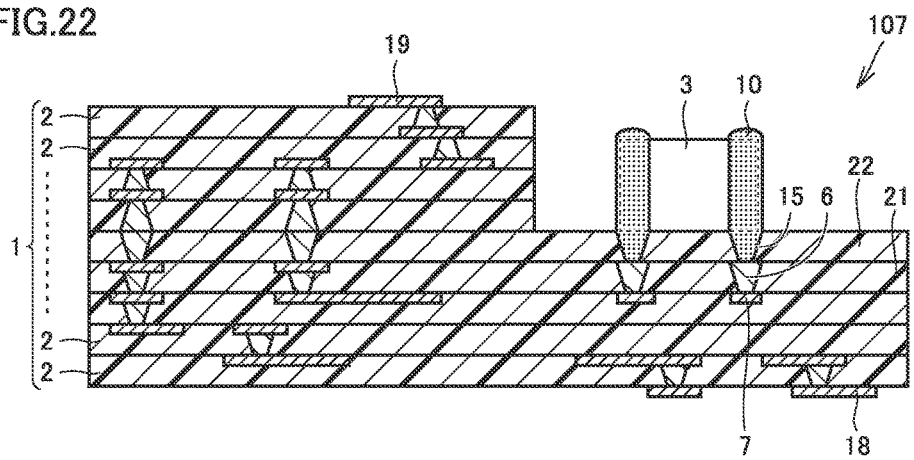
FIG. 22 is an illustrative diagram of a seventh step of the method of manufacturing the resin multilayer substrate according to the seventh preferred embodiment of the present invention.

Furthermore, as shown in FIG. 22, component 3 including external electrode 10 may be mounted. Component 3 is electrically connected via interlayer connecting conductors 6 exposed at openings 15. The bonding material resulting from melting of a portion of external electrode 10 enters openings 15 and reaches interlayer connecting conductors 6. The bonding material is cured in this state, whereby component 3 is fixed.

According to this preferred embodiment, a resin multilayer substrate that readily achieves a smaller gap between mounted components is obtained in this manner. In addition, according to this preferred embodiment, a resin multilayer substrate can be obtained on which a component can be mounted without using solder, or, without any problems if solder is used. In particular, since interlayer connecting conductors 6 are exposed by making openings 15 by performing the machining after laminate 1 has been formed, interlayer connecting conductors 6 having a small size are able to be readily addressed. In addition, the accuracy of positions where interlayer connecting conductors 6 are to be exposed is increased. Known machining methods can be used as appropriate in order to make openings 15. During the heating and pressurization for forming integrated laminate 1, the material for resin layers 2 is fluidized, which may result in holes being closed or reduced in size if the holes have already been formed. In this embodiment, openings 15 are made after the plurality of resin layers 2 have already been integrated as laminate 1, thereby avoiding such a problem.

Moreover, since openings 15 are provided separately to correspond to interlayer connecting conductors 6, respectively, a short circuit between the bonding materials is able to be readily prevented. Accordingly, this is also advantageous to achieve a smaller gap between mounted components.

It is preferable that the removal machining performed in step S4 be laser machining. While this removal machining may be performed with a method other than the laser machining, the laser machining is preferable because it is able to be performed swiftly and accurately.

It is preferable that the method of manufacturing the resin multilayer substrate include a step of bonding a component including a Sn-plated bonding surface to the interlayer connecting conductor, with the above Sn-plated surface as a bonding surface. This is because the inclusion of such a step allows direct bonding of the component to the interlayer connecting conductor without using solder.

Eighth Preferred Embodiment

Referring to FIGS. 23 to 26, a method of manufacturing a resin multilayer substrate according to an eighth embodiment of the present invention is described. The method of manufacturing the resin multilayer substrate in this preferred embodiment is also in accordance with the flowchart shown in FIG. 15.

Each step until integrated laminate 1 is obtained is basically the same as that described in the seventh preferred embodiment.

Figure 23:
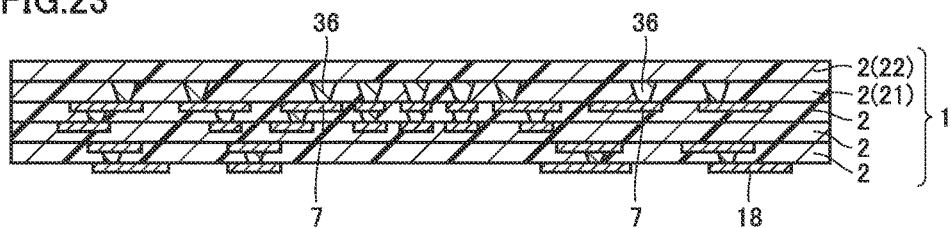
FIG. 23 is a cross-sectional view after a laminate has been obtained from a plurality of resin layers with a method of manufacturing a resin multilayer substrate according to an eighth preferred embodiment of the present invention.
Figure 24:
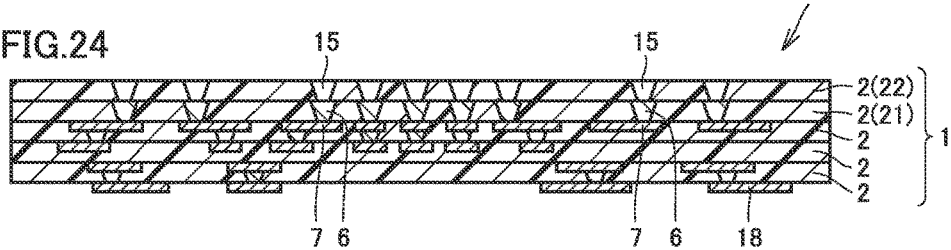
FIG. 24 is an illustrative diagram of a step of forming openings in the laminate with the method of manufacturing the resin multilayer substrate according to the eighth preferred embodiment of the present invention.

Through steps S1 to S4, holes extending through second resin layer 22 included in integrated laminate 1 as shown in FIG. 23 are made by performing removal machining on second resin layer 22. That is, openings 15 are formed as shown in FIG. 24. Consequently, the surfaces of interlayer connecting conductors 36 held in first resin layer 21 facing second resin layer 22 are directly exposed. Interlayer connecting conductors 36 define and function as interlayer connecting conductors 6. A resin multilayer substrate 108 is thus obtained.

Figure 25:
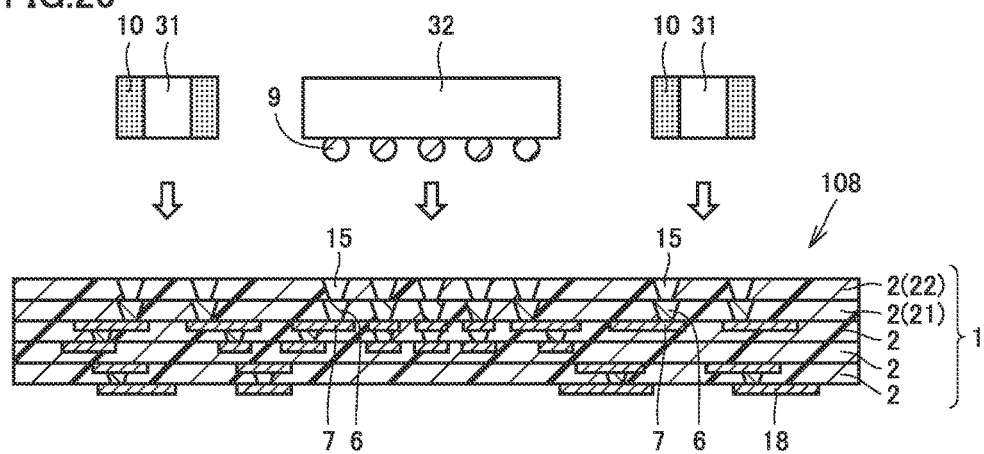
FIG. 25 is an illustrative diagram of a step of mounting components on the laminate with the method of manufacturing the resin multilayer substrate according to the eighth preferred embodiment of the present invention.
Figure 26:
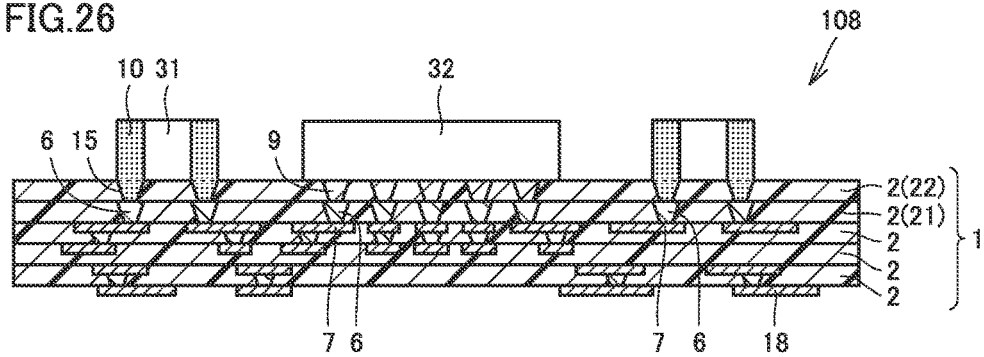
FIG. 26 is a cross-sectional view after the components have been mounted on the laminate with the method of manufacturing the resin multilayer substrate according to the eighth preferred embodiment of the present invention.
Figure 27:
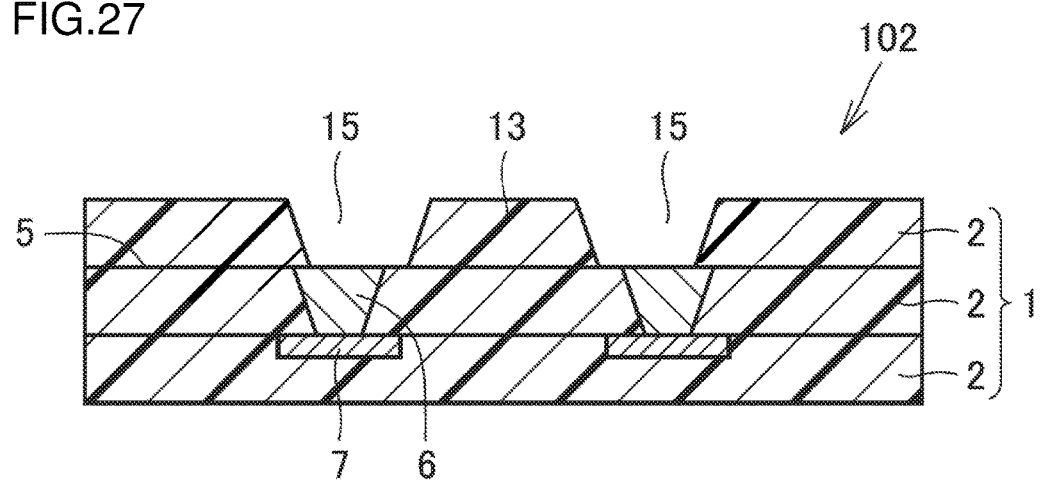
FIG. 27 is a cross-sectional view of a resin multilayer substrate according to another preferred embodiment of the present invention.

In addition, as shown in FIG. 25, components 31 and 32 are mounted on the surface. Each component 31 includes external electrode 10. Component 32 includes bumps 9 at its lower surface. Components 31 and 32 as shown here are merely exemplary. Components 31 and 32 are electrically connected via interlayer connecting conductors 6 exposed at openings 15. The bonding material resulting from melting of a portion of external electrode 10 has entered openings 15 and reached interlayer connecting conductors 6. Bumps 9 melt in openings 15 and deform in accordance with the shape of openings 15, and reach interlayer connecting conductors 6 exposed at the bottoms of openings 15. A resin multilayer substrate 108 as shown in FIG. 26 is thus obtained.

As has been demonstrated in this preferred embodiment, the mounting of a plurality of components, or, even the mounting of different types of components in a mixed manner is thus able to be addressed. The same effect as described in the seventh embodiment is able to be obtained in this preferred embodiment as well.

It should be noted that the preferred embodiments disclosed herein are illustrative and non-restrictive in every respect. The scope of the present invention is defined by the terms of the claims, rather than the description above, and is intended to include any modifications within the scope and meaning equivalent to the terms of the claims.

Preferred embodiments of the present invention are able to be utilized for a resin multilayer substrate and a method of manufacturing the same.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A resin multilayer substrate comprising:
a laminate including a plurality of resin layers and at least two interlayer connecting conductors which extend through at least one of the plurality of resin layers and which are directly exposed to an outside of the laminate; wherein
each of the at least two interlayer connecting conductors is a conductor on which a component is to be mounted;
the at least two interlayer connecting conductors are spaced a distance from each other along one main surface of the laminate;
a raised portion is provided between the at least two interlayer connecting conductors and is higher than an upper main surface of one of the plurality of resin layers containing the at least two interlayer connecting conductors and a portion of the upper main surface at which the at least two interlayer connecting conductors are exposed;
the at least two interlayer connecting conductors are spaced a distance from the raised portion;
each of the at least two interlayer connecting conductors extending through the at least one of the plurality of resin layers is a direct via, and the direct via extends through an entire thickness of the at least one of the plurality of resin layers and is exposed to the outside of the laminate; and
each of the direct vias extends from the upper main surface of the one of the plurality of resin layers to a lower main surface of the one of the plurality of resin layers, the lower main surface directly contacting another one of the plurality of resin layers.

2. The resin multilayer substrate according to claim 1, wherein the at least two interlayer connecting conductors are made of a variable melting point bonding material.

3. The resin multilayer substrate according to claim 2, wherein
the variable melting point bonding material is a conductive material including a metallic component made of a first metal and a second metal having a higher melting point than the first metal and producing an intermetallic compound by reaction with the first metal;
the first metal is Sn or an alloy containing greater than or equal to about 70 weight % Sn;
the second metal is a Cu—Mn alloy or Cu—Ni alloy; and
the first metal and the second metal are conductive materials that produce an intermetallic compound exhibiting a melting point of greater than or equal to about 310° C.

4. The resin multilayer substrate according to claim 1, wherein a component including a Sn-plated bonding surface is bonded to the at least two interlayer connecting conductors, with the Sn-plated surface defining a bonding surface.

5. The resin multilayer substrate according to claim 1, wherein the at least two interlayer connecting conductors include a via hole.

6. The resin multilayer substrate according to claim 5, wherein the via hole has a truncated conical shape.

7. The resin multilayer substrate according to claim 1, wherein an upper surface of the laminate includes an opening at which one of the at least two interlayer connecting conductors is exposed.

8. The resin multilayer substrate according to claim 1, wherein the raised portion and openings at which the at least two interlayer connecting conductors are exposed in a second one of the plurality of resin layers have a taper-shaped structure.

9. A resin multilayer substrate comprising:
a laminate including a plurality of resin layers and at least two interlayer connecting conductors which extend through at least one of the plurality of resin layers and which are directly exposed to an outside of the laminate; wherein
each of the at least two interlayer connecting conductors is a conductor on which a component is to be mounted;
the at least two interlayer connecting conductors are spaced a distance from each other along one main surface of the laminate;
a raised portion is provided between the at least two interlayer connecting conductors and is higher than an upper main surface of one of the plurality of resin layers containing the at least two interlayer connecting conductors at which the at least two interlayer connecting conductors and a portion of the upper main surface are exposed;
the at least two interlayer connecting conductors are spaced a distance from the raised portion where no conductors are between one of the at least two interlayer connecting conductors and the raised portion;
each of the at least two interlayer connecting conductors extending through the at least one of the plurality of resin layers is a direct via, and the direct via is exposed to the outside of the laminate; and
each of the direct vias extends from the upper main surface of the one of the plurality of resin layers to a lower main surface of the one of the plurality of resin layers, the lower main surface directly contacting another one of the plurality of resin layers.

10. A resin multilayer substrate comprising:
a laminate including a plurality of resin layers and at least two interlayer connecting conductors which extend through at least one of the plurality of resin layers and which are directly exposed to an outside of the laminate; wherein
each of the at least two interlayer connecting conductors is a conductor on which a component is to be mounted;
the at least two interlayer connecting conductors are spaced a distance from each other along one main surface of the laminate;
a raised portion is provided between the at least two interlayer connecting conductors and is higher than a surface of one of the plurality of resin layers containing the at least two interlayer connecting conductors at which the at least two interlayer connecting conductors are exposed;
the at least two interlayer connecting conductors are spaced a distance from the raised portion;
each of the at least two interlayer connecting conductors extending through the at least one of the plurality of resin layers is a direct via, and the direct via is exposed to the outside of the laminate;
each of the at least two interlayer connecting conductors has a truncated cone shape;
each of the at least two interlayer connecting conductors has a first main surface and a second main surface which has a smaller diameter than the first main surface;
the second main surface is electrically connected to a conductive pattern located inside the laminate; and
a second one of the plurality of resin layers covers at least a portion of an outer periphery of the first main surface of each of the at least two interlayer connecting conductors, in a state of exposing at least a center portion of each of the at least two interlayer connecting conductors, and overlaps the at least one of the plurality of resin layers.

* * * * *